United States Patent
Huang

(10) Patent No.: US 8,981,397 B2
(45) Date of Patent: Mar. 17, 2015

(54) LIGHT-EMITTING DEVICES ON TEXTURED SUBSTRATES

(75) Inventor: Hsin-Chieh Huang, Hsin-Chu (TW)

(73) Assignee: TSMC Solid State Lighting Ltd., Hsin-Chu (TW)

( * ) Notice: Subject to any disclaimer, the term of this patent is extended or adjusted under 35 U.S.C. 154(b) by 455 days.

(21) Appl. No.: 12/704,997

(22) Filed: Feb. 12, 2010

(65) Prior Publication Data
US 2011/0198637 A1    Aug. 18, 2011

(51) Int. Cl.
*H01L 33/00* (2010.01)
*H01L 33/20* (2010.01)
*H01L 33/46* (2010.01)

(52) U.S. Cl.
CPC ............ *H01L 33/20* (2013.01); *H01L 33/46* (2013.01)
USPC .................................. 257/95; 257/79; 257/98

(58) Field of Classification Search
USPC ................................ 257/79, 95, 98
See application file for complete search history.

(56) References Cited

U.S. PATENT DOCUMENTS

| | | | |
|---|---|---|---|
| 7,419,912 B2 | 9/2008 | Donofrio | |
| 7,691,650 B2 * | 4/2010 | Yoo | 438/22 |
| 2002/0063521 A1 * | 5/2002 | Salam | 313/512 |
| 2004/0046180 A1 * | 3/2004 | Takaoka | 257/98 |
| 2004/0119668 A1 * | 6/2004 | Homma et al. | 345/82 |
| 2004/0173808 A1 * | 9/2004 | Wu | 257/99 |
| 2006/0183982 A1 * | 8/2006 | Shioi | 600/310 |
| 2008/0061310 A1 * | 3/2008 | Chiu et al. | 257/98 |
| 2009/0242918 A1 | 10/2009 | Edmond et al. | |

FOREIGN PATENT DOCUMENTS

| | | |
|---|---|---|
| CN | 1637494 | 7/2005 |
| CN | 1969405 | 5/2007 |

OTHER PUBLICATIONS

Chinese Patent Office, Office Action dated May 11, 2012, Application No. 201010251093.7, 4 pages.

* cited by examiner

*Primary Examiner* — Jae Lee
(74) *Attorney, Agent, or Firm* — Haynes and Boone, LLP

(57) ABSTRACT

A device includes a textured substrate, which further includes a plurality of trenches. Each of the plurality of trenches includes a first sidewall and a second sidewall opposite the first sidewall. A plurality of reflectors configured to reflect light is formed, with each of the plurality of reflectors being on one of the first sidewalls of the plurality of trenches. The second sidewalls of the plurality of trenches are substantially free from any reflector.

22 Claims, 5 Drawing Sheets

LIGHT-EMITTING DEVICES ON TEXTURED SUBSTRATES

TECHNICAL FIELD

This disclosure relates generally to light-emitting devices (LEDs), and more particularly to the methods of manufacturing LEDs on textured substrates and the resulting structures.

BACKGROUND

Light-emitting devices (LEDs), such as light-emitting diodes or laser diodes, are widely used for many applications. As is well known to those skilled in the art, an LED may include a semiconductor light-emitting element having a plurality of semiconductor layers formed on a substrate. The substrate may be formed of, for example, gallium arsenide, gallium phosphide, alloys thereof, sapphire and/or silicon carbide. Continued development in LEDs has resulted in highly efficient and mechanically robust light sources that can cover the visible spectrum and beyond. These attributes, coupled with the potentially long service life of solid state devices, may enable a variety of new display applications, and may place LEDs in a position to compete with the well entrenched incandescent and fluorescent lamps.

LEDs emit light from active layers. Accordingly, light may be extracted from the opposite sides of the active layers. However, in certain situations, for example, when used for illumination, it may be preferred that the light is directed to only one side of an active layer, with the light being scattered to achieve a more uniform light distribution. Conventionally, patterned package substrates are bonded onto the LED chips to direct light to desirable directions. This, however, will increase the cost and complexity in the formation of the package substrates and the bonding process for bonding LED chips onto the package substrates. In addition, the solutions in package substrates did not help improve the light-extraction efficiency.

SUMMARY

In accordance with one aspect, a device includes a textured substrate, which further includes a plurality of trenches. Each of the plurality of trenches includes a first sidewall and a second sidewall opposite the first sidewall. A plurality of reflectors configured to reflect light is formed, with each of the plurality of reflectors being on one of the first sidewalls of the plurality of trenches. The second sidewalls of the plurality of trenches are substantially free from any reflector.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative and do not limit the scope of the disclosure.

A novel light-emitting device (LED) in accordance with an embodiment and the method of forming the same are presented. The intermediate stages of manufacturing an embodiment are illustrated. The variations and the operation of the embodiment are then discussed. Throughout the various views and illustrative embodiments, like reference numbers are used to designate like elements.

Figure 1:
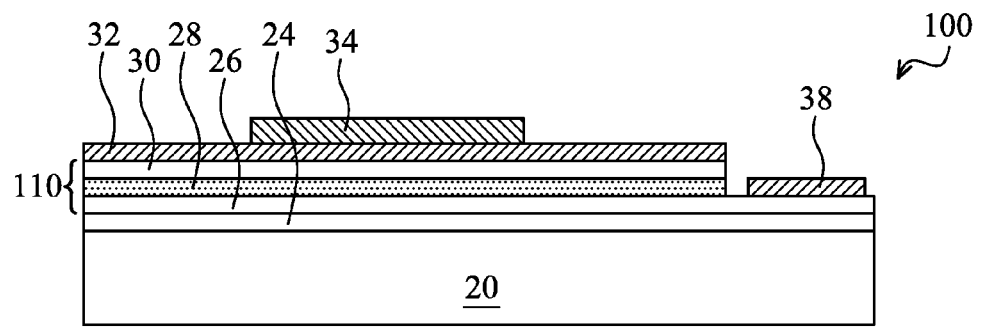
FIGS. 1 through 5 are cross-sectional views and a top view of intermediate stages in the manufacturing of a light-emitting device (LED) in accordance with an embodiment, wherein a textured substrate is formed after the LED is formed.

FIG. 1 illustrates chip 100, which may be a part of an un-diced wafer comprising a plurality of identical chips. Alternatively, the structure shown in FIG. 1 may be a discrete chip that is already separated from a wafer. Chip 100 includes LED 110 formed over substrate 20. In various embodiments, substrate 20 is formed of sapphire ($Al_2O_3$). In alternative embodiments, substrate 20 is a silicon-containing substrate, such as a silicon carbide substrate, a silicon substrate, or a silicon germanium substrate. In yet other embodiments, substrate 20 comprises compound semiconductor materials comprising group-III and/or group-V elements, or also known as III-V compound semiconductor materials.

In an exemplary embodiment, before LED 110 is formed, buffer layer 24 is formed on substrate 20. Buffer layer 24 may comprise un-doped gallium nitride (u-GaN). A plurality of layers for forming LED 110 is then formed layer-by-layer on buffer layer 24. For example, LED 110 includes cladding layer 26 of a first conductivity type (p-type or n-type). Cladding layer 26 may be an n-type group-III/V compound (III/V compound) layer, such as an n-GaN layer (GaN doped with an n-type impurity). At least one multiple quantum well (MQW) 28 that acts as an active layer for emitting light is formed on cladding layer 26. MQW 28 may be formed of, for example, InGaN. Cladding layer 30, which is of a second conductivity type opposite the first conductivity type, is formed on MQW 28. Cladding layer 30 may be a p-type III/V compound layer, such as a p-GaN layer (GaN doped with a p-type impurity).

An ohmic contact layer (not shown, for example, formed of GaAs) may optionally be formed over cladding layer 30. Reflector 32 is formed over (and may be formed over the ohmic contact layer) cladding layer 30. Reflector 32 may be formed of a metallic material, such as Al, Cu, Ti, TiN, TiW, or alloys thereof. Top electrodes (which are also bond pads) 34 and 38 are formed to electrically connect to cladding layers 30 and 26, respectively. Accordingly, by applying a voltage between electrodes 34 and 38, LED 110 may be activated to emit light.

The formation of layers 26, 28, 30, and 32 are known in the art, and hence are not described herein. In an exemplary embodiment, the formation methods of layers 26, 28, and 30 include epitaxial growth. It is realized that LED 110 may have many designs, which are also in the scope of the present disclosure. For example, the materials of each of layers 26, 28, and 30 may be different from the above-discussed materials.

Figure 2:
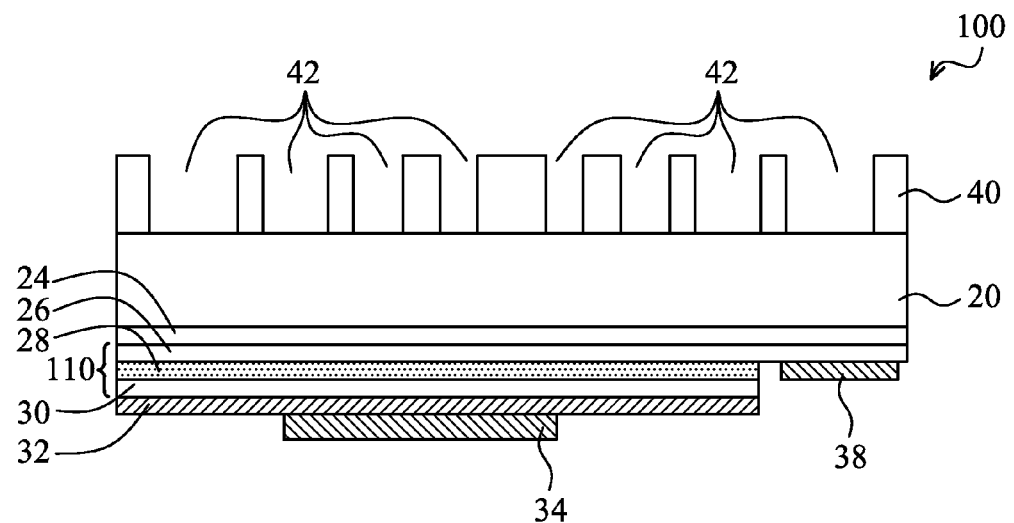
Figure 3A:
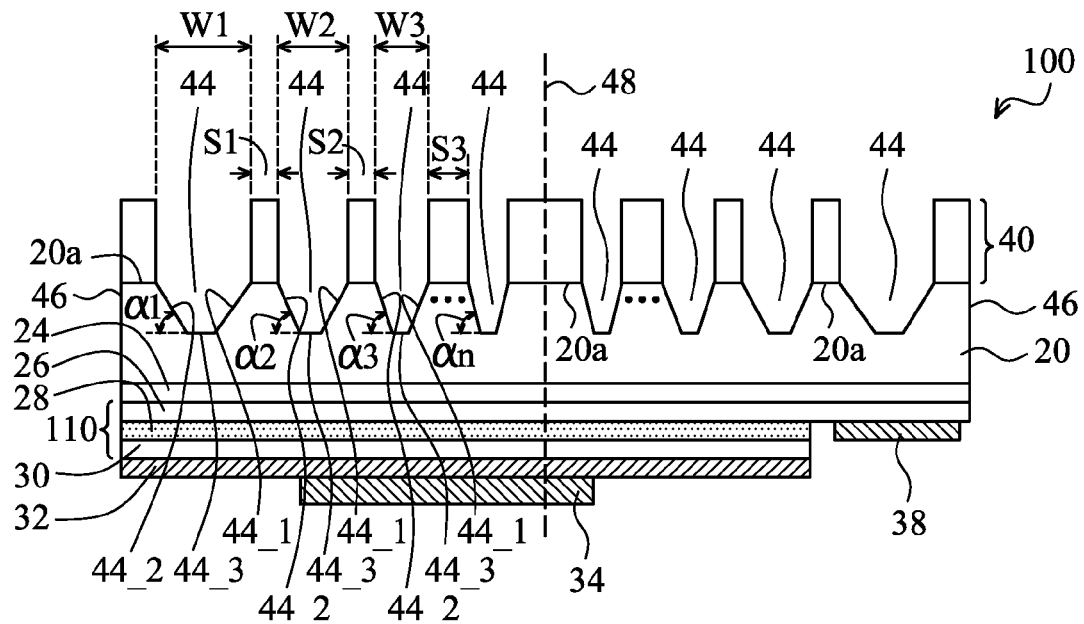

Referring to FIG. 2, after LED 110 is formed, chip 100 is flipped upside down. Photo resist 40 is then formed on substrate 20, and is patterned to form openings 42. As shown in FIG. 3A, substrate 20 is then etched through openings 42. Trenches 44 are thus formed in substrate 20 and extend from top surface 20a of substrate 20 into substrate 20. Trenches 44 include inner sidewalls 44_1, outer sidewalls 44_2, and bottoms 44_3. Inner sidewalls 44_1 face away from center 48 of chip 100, while outer sidewalls 44_2 face toward center 48. Inner sidewalls 44_1, outer sidewalls 44_2, and bottoms 44_3 may be substantially straight in the cross-sectional view or curved slightly.

Figure 3B:
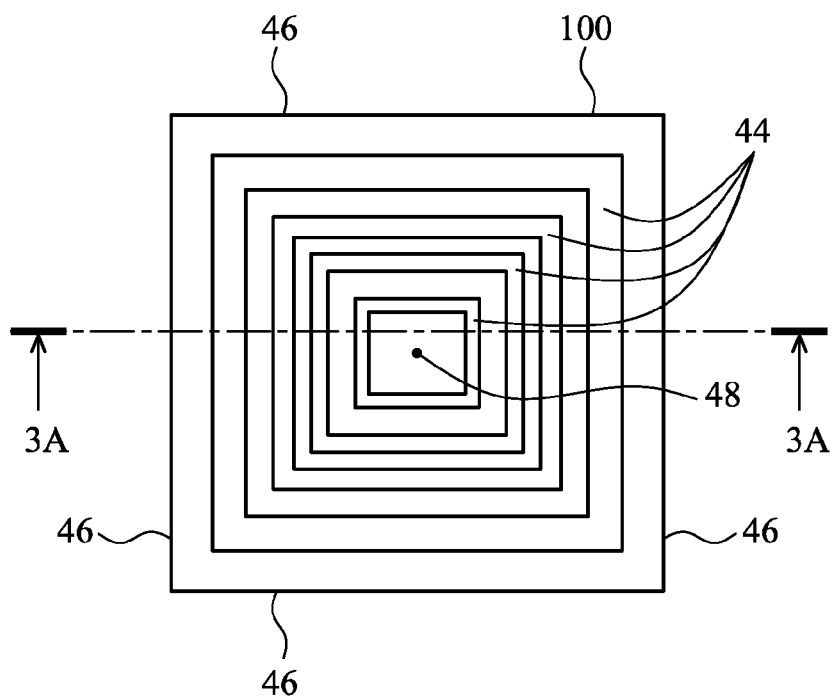

FIG. 3B schematically illustrates a top view of the structure shown in FIG. 3A, wherein the cross-sectional view is obtained from the plane crossing line 3A-3A in FIG. 3B. In an embodiment, trenches 44 (and the portion of un-etched substrate 20 between trenches 44) form closed loops, which may have four straight sides, each being parallel to one of edges 46 of chip 100. In alternative embodiments, trenches 44 may be in the form of circles. In yet other embodiments, trenches 44 may have near-square shapes with straight edges and curved corners. Trenches 44 may be symmetric relative to center 48 of chip 100.

Referring back to FIG. 3A, in an embodiment, outer sidewalls 44_2 form slant angles α (illustrated as α1, α2, α3, and an) with major surface 20a (the horizontal surface in FIG. 3A) of substrate 20. Slant angles α may be greater than about 45 degrees, and may be between about 45 degrees and 90 degrees. With such slant angles, the vertical light, as shown by arrows in FIG. 5, will be reflected upwardly, rather than downwardly.

Chip 100 has edges 46. In an embodiment, the slant angles α closer to edges 46 are smaller than the slant angles α closer to center 48. In a direction from edges 46 to center 48, the increase in slant angles α may also be gradual. The differences in slant angles α of outer sidewalls 44_2 may be achieved by controlling the pattern size of trenches 44 in different regions of chip 100. For example, under some etching conditions, a wider width (W1) would produce a trench with a smaller slant angle. Generally, the widths W1, W2, W3 . . . of trenches 44 (refer to FIG. 3A), which are arranged from edges 46 toward center 48, may be increasingly greater, smaller, stay the same, or change in a random fashion in the direction from edges 46 to center 48. Further, in the direction from edges 46 toward center line 48, spacings S1, S2, S3 . . . between neighboring trenches 44 (refer to FIG. 3A), may be increasingly greater, smaller, stay the same, or change in a random fashion. The slant angles α closest to edges 46 may be close to about 45 degrees, while the slant angles α closest to center 48 may be close to 90 degrees. Such arrangements result in the micro-loading effect in the etching of substrate 20 during the formation of trenches 44, and hence result in the difference in slant angles α. The optimum distribution of widths (W1/W2/W3 and so on) and spacings (S1/S2/S3 and so on) partially depend on the LED light direction requirements and may be found through experiments. After the formation of trenches 44, photo resist 40 is removed.

In alternative embodiments, instead of using etching to form trenches 44, other applicable methods, such as laser micro-machining may also be used. For example, a mask (not shown, which can be a polymer mask) may be formed over the flat substrate 20. Patterns may be formed in the mask, with the patterns in the mask being similar to the desirable pattern of trenches 44. The mask and the underlying substrate 20 are then etched using an etchant attacking both substrate 20 and the mask. As a result, the portions of substrate 20 over which the mask is thinner are etched more than the portions of substrate 20 over which the mask is thicker. Accordingly, the pattern in the mask is transferred to substrate 20.

Figure 4:
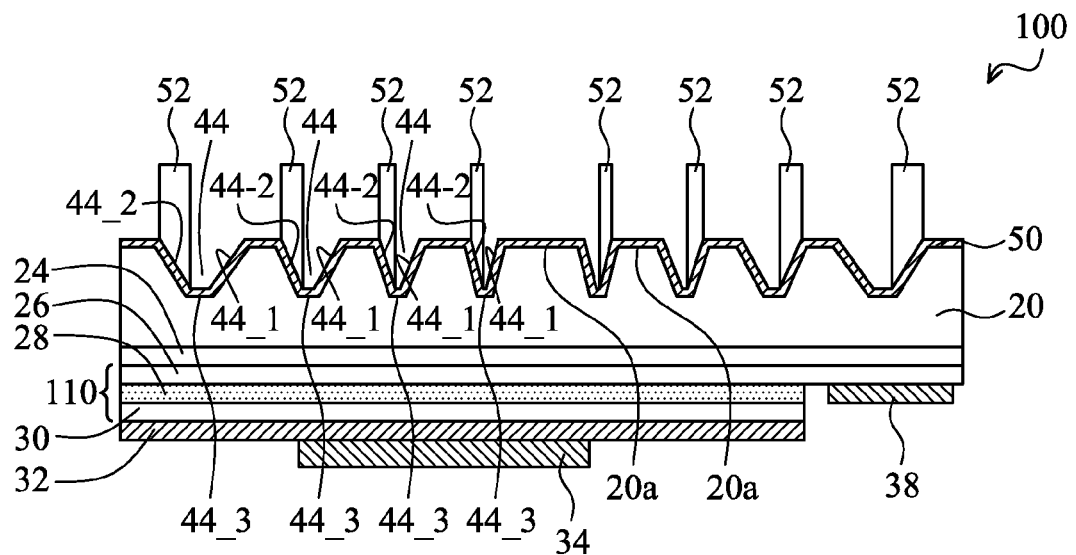

In FIG. 4, reflective layer 50 is formed on substrate 20. Reflective layer 50 may be a conformal layer formed using, for example, electro or electroless plating or a physical vapor deposition (PVD), chemical vapor deposition (CVD), atomic layer deposition (ALD), or other known semiconductor deposition method. The materials of reflective layer 50 may include metals, such as Al, Cu, Ti, TiN, and/or alloys thereof. The thickness of reflective layer 50 may be between about 50 nm and about 2,000 nm, for example. Reflective layer 50 extends into trenches 44, and is formed on sidewalls 44_1 and 44_2 and bottoms 44_3. Next, photo mask 52 is formed and patterned. After patterning, photo mask 52 may leave the portions of reflective layer 50 on bottoms 44_3 and inner sidewalls 44_1 of trenches 44 uncovered. Also, the flat portions of top surface 20a of substrate 20 are not covered. The portions of reflective layer 50 on outer sidewalls 44_2 are covered by photo mask 52. Next, the exposed portions of reflective layer 50 are removed, while the covered portions of reflective layer 50 remain to form a plurality of reflectors 50'. The resulting structure is shown in FIG. 5.

Figure 5:
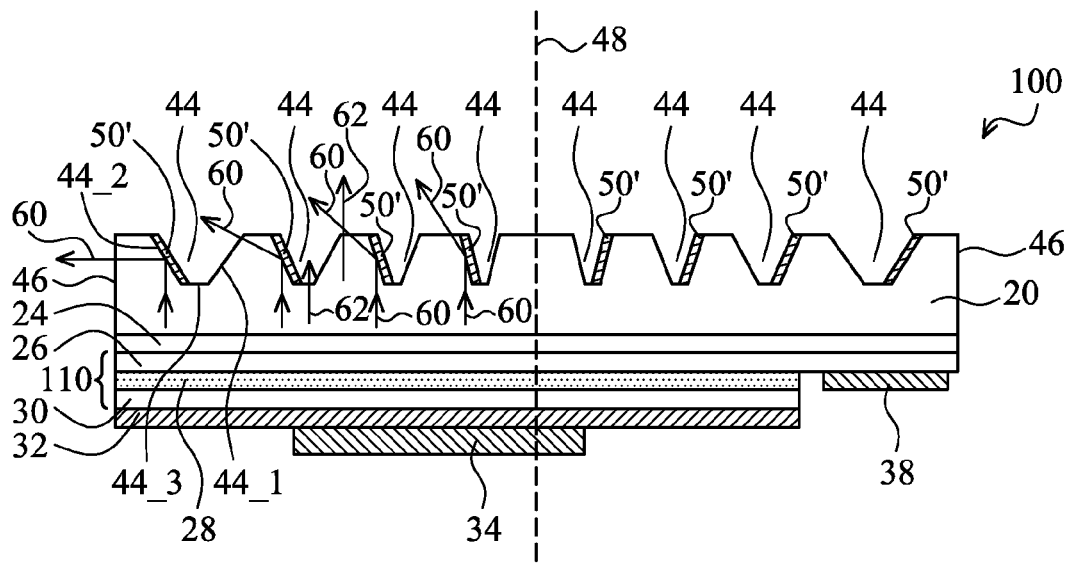

FIG. 5 schematically illustrates the light reflected from reflectors 50'. It is observed that reflectors 50', with different slant angles α, result in the light to be redirected to different directions. With the reflection of reflectors 50', the light (symbolized by arrows 60) emitted by LED 110 is scattered and is redistributed more uniformly. In locations having no reflectors 50', light (symbolized by arrows 62) is not reflected. With the redirection of the light by reflectors 50', the light extraction efficiency is improved so that less light is absorbed in the LED structure. Since from edges 46 toward center 48, the slant angles α of outer sidewalls 44_2 become increasingly greater, reflectors 50' closer to edges 46 of chip 100 will not block the light reflected from reflectors 50' closer to center 48. Further, the gradual increase in slant angles α improves the uniformity in the distribution of the light.

Figure 6:
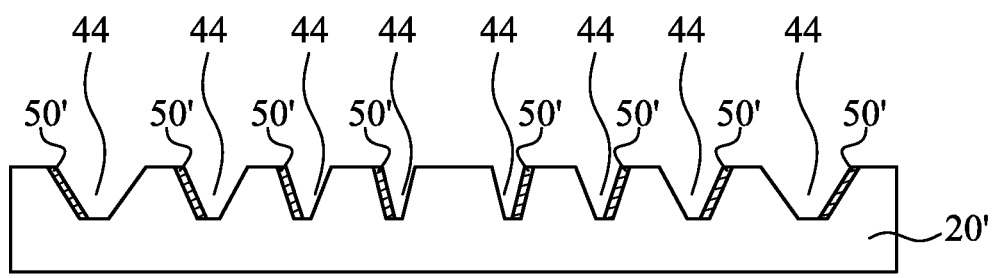
FIGS. 6 through 8 are cross-sectional views of intermediate stages in the manufacturing of a textured substrate in accordance with an alternative embodiment, wherein the textured substrate is pre-formed before the LED is bonded thereon.
Figure 7:
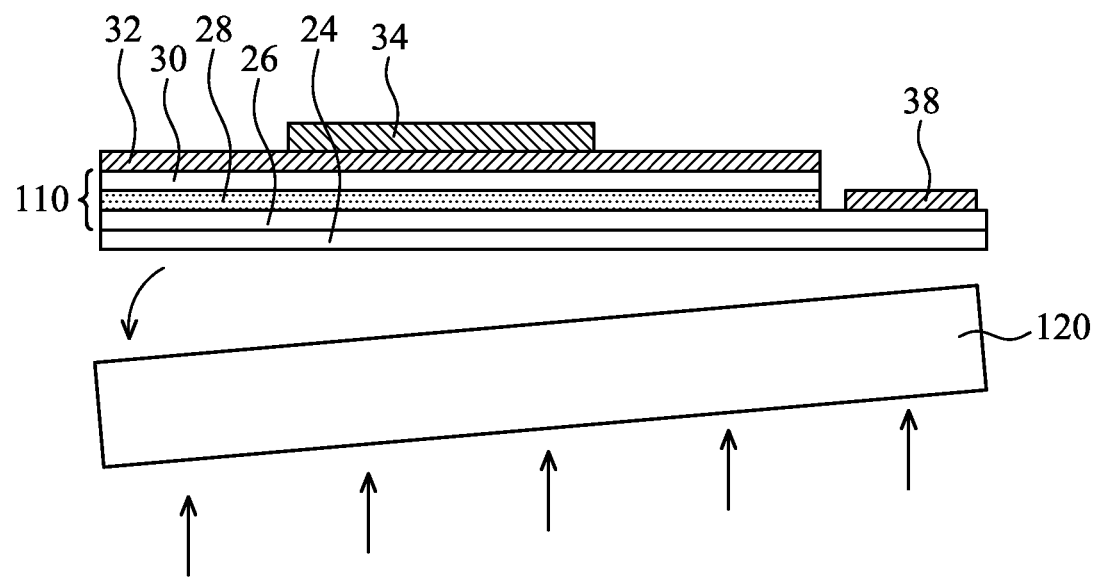
Figure 8:
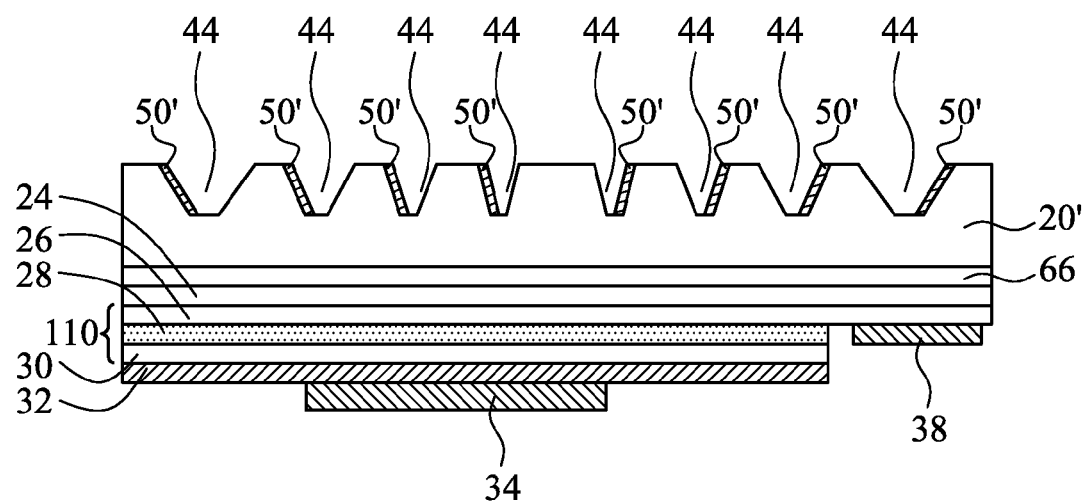

FIGS. 6 through 8 illustrate the intermediate stages in the formation of an LED structure in accordance with an alternative embodiment. Unless specified otherwise, reference numerals in this embodiment represent like elements as in the embodiment shown in FIGS. 1 through 5. In this embodiment, the textured substrate is pre-formed and then bonded onto the LED. Referring to FIG. 6, textured substrate 20' is provided, on which reflectors 50' are formed. The formation processes of reflectors 50' may be essentially the same as shown in FIGS. 2 through 5, and are not repeated herein. In this embodiment, since substrate 20' is not used to grow an LED thereon, substrate 20' be formed of materials that are more transparent, which materials do not have to be suitable for growing LEDs thereon. For example, substrate 20' may be formed of silicon, glass, or the like, although it may also be formed of the same materials as substrate 20 as in FIG. 1.

FIG. 7 illustrates the laser lift off of an LED from a substrate. For example, LED 110 is formed on substrate 120, wherein buffer layer 24 may be formed of un-doped GaN. LED 110 may be essentially the same as shown in FIG. 5. In an exemplary embodiment, substrate 120 is exposed to a light energy, such as a laser beam (symbolized by arrows) projecting from the bottom of substrate 120. The laser beam penetrates through substrate 120 to reach layer 24. As a result, buffer layer 24 is decomposing by the heat resulting from the laser beam, and hence LED 110 is separated from substrate 120. In an embodiment, the laser is a KrF laser with a wavelength of about 248 nm. Next, as shown in FIG. 8, LED 110 is bonded onto textured substrate 20', for example, using transparent adhesive 66.

It is observed that the embodiments may be implemented directly onto the substrates on which the LEDs are grown. Accordingly, the embodiments provide a manufacturing and packaging process with a low cost and a low complexity.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
    a textured substrate comprising:
        a plurality of trenches, with each of the plurality of trenches comprising a first sidewall and a second sidewall opposite the first sidewall and a planar bottom surface adjoining the first and second sidewalls; and
        a plurality of reflectors configured to reflect light, with each of the plurality of reflectors on one of the first sidewalls of the plurality of trenches, wherein the second sidewalls of the plurality of trenches are substantially free from any reflector, and wherein the bottom surfaces of the plurality of trenches each have a portion that is free from reflectors; and
    a light-emitting device (LED) disposed over a surface of the textured substrate, wherein the LED and the plurality of reflectors are disposed on opposite sides of the textured substrate.

2. The device of claim 1 further comprising an additional reflector, wherein the addition reflector and the textured substrate are on opposite sides of the LED.

3. The device of claim 1, wherein the textured substrate is in a chip, and wherein the plurality of trenches forms closed loops encircling a center of the chip.

4. The device of claim 3, wherein the closed loops are substantially symmetric relative to the center of the chip.

5. The device of claim 3, wherein the first sidewall is an outer sidewall facing toward the center of the chip, and the second sidewall is an inner sidewall facing away from the center of the chip.

6. The device of claim 5, wherein the inner sidewalls of the plurality of trenches close to an edge of the chip have slant angles from horizontal smaller than the inner sidewalls of the plurality of trenches close to the center of the chip.

7. The device of claim 6, wherein a slant angle of an outer sidewall of one of the plurality of trenches close to the edge is close to 45 degrees from horizontal, and a slant angle of an outer sidewall of one of the plurality of trenches close to the center is close to 90 degrees from horizontal.

8. The device of claim 1, wherein the textured substrate is in a chip, and wherein the plurality of trenches has a first pattern density in regions of the chip close to an edge of the chip and a second pattern density in regions of the chip close to a center of the chip, and wherein the first and second densities are different.

9. The device of claim 1, wherein portions of a top surface of the textured substrate between neighboring trenches of the plurality of trenches are free from reflectors.

10. The device of claim 1, wherein the plurality of reflectors comprises a metal.

11. A chip comprising:
    a substrate comprising a plurality of trenches comprising inner sidewalls facing away from a center of the chip and outer sidewalls facing toward the center of the chip, wherein each of the plurality of trenches forms a loop around the center of the chip;
    a plurality of reflectors on the outer sidewalls of the plurality of trenches, and wherein the inner sidewalls of the plurality of trenches and bottoms of the plurality of trenches are substantially free from any reflector; and
    a light-emitting device (LED) attached to the substrate on an opposite surface from the plurality of reflectors.

12. The chip of claim 11, wherein in a direction from an edge of the chip to the center of the chip, the outer sidewalls of the plurality of reflectors have increasingly greater slant angles.

13. A chip comprising:
    a substrate comprising a plurality of trenches comprising inner sidewalls facing away from a center of the chip, and outer sidewalls facing toward the center;
    a plurality of reflectors on the outer sidewalls of the plurality of trenches, wherein the inner sidewalls and bottoms of the plurality of trenches are substantially free from reflectors;
    a light-emitting device (LED), with the plurality of reflectors and the LED being on opposite sides of the substrate; and
    an additional reflector on the LED, wherein the additional reflector and the LED are on opposite sides of the substrate.

14. The chip of claim 13, wherein the outer sidewalls of the plurality of trenches have non-uniform slant angles.

15. The chip of claim 13 further comprising an adhesive adjoining the substrate to the LED.

16. The chip of claim 13, wherein the chip is free from any adhesive contacting the substrate and between the substrate and LED.

17. A device, comprising:
    a chip package that includes:
        a substrate having a first side and a second side opposite the first side, wherein the substrate contains a plurality of recesses formed in the first side, each recess being defined by a planar bottom surface and a plurality of sidewall surfaces;
        a reflective material partially, but not completely, disposed over each of the recesses in a manner such that for each recess, the bottom surface includes a segment that is free of the reflective material; and
        a light-emitting diode (LED) disposed over the second side of the substrate in a manner such that the substrate is vertically disposed between the LED and an entirety of the reflective material.

18. The device of claim 17, wherein at least some of the recesses circumferentially surround a center of the LED from a planar view.

19. The device of claim 17, wherein the recesses have different slant angles as a function of their respective positions on the chip package.

20. The device of claim 17, wherein the reflective material in each recess covers less than half of a total surface of the recess.

21. The device of claim 17, wherein at least one sidewall surface for each recess is free of the reflective material.

22. The device of claim 17, wherein the reflective material contains a metal.

* * * * *